US005609910A

United States Patent [19]

Hackleman

[11] Patent Number: 5,609,910

[45] Date of Patent: Mar. 11, 1997

[54] METHOD FOR FORMING THERMAL-INK HEATER ARRAY USING RECTIFYING MATERIAL

[75] Inventor: David E. Hackleman, Monmouth, Oreg.

[73] Assignee: Hewlett-Packard Company, Palo Alto, Calif.

[21] Appl. No.: 370,947

[22] Filed: Jan. 10, 1995

Related U.S. Application Data

[62] Division of Ser. No. 925,355, Aug. 3, 1992, Pat. No. 5,414,245.

[51] Int. Cl.[6] .............................. B05D 5/12; C23C 16/00

[52] U.S. Cl. .......................... 427/102; 427/103; 427/593; 427/265; 437/904

[58] Field of Search .................................. 427/592, 593, 427/594, 101, 102, 103, 265, 266, 269; 437/904, 917

[56] References Cited

U.S. PATENT DOCUMENTS

| | | | |
|---|---|---|---|
| 3,515,850 | 10/1967 | Cady, Jr. . | |
| 3,736,406 | 5/1973 | Vossen et al. | 219/216 |
| 3,769,562 | 10/1973 | Bean | 317/235 |
| 3,781,983 | 1/1974 | Hiruma et al. | 29/611 |
| 3,815,144 | 6/1974 | Aiken | 346/35 |
| 3,852,563 | 12/1974 | Bohorquez et al. | 219/216 |
| 3,931,492 | 1/1976 | Takano et al. | 219/216 |
| 4,099,046 | 7/1978 | Boynton et al. | 219/216 |
| 4,123,647 | 10/1978 | Oda | 219/216 |
| 4,213,030 | 7/1980 | Kawamura et al. | 219/216 |
| 4,232,212 | 11/1980 | Baraff et al. | 219/216 |
| 4,250,375 | 2/1981 | Tsutsumi et al. | 219/216 |
| 4,252,991 | 2/1981 | Iwabushi | 174/68.5 |
| 4,322,733 | 3/1982 | Moriguchi et al. | 219/216 |
| 4,368,491 | 1/1983 | Sauto | 358/283 |
| 4,401,881 | 8/1983 | Saito | 219/216 |
| 4,695,853 | 9/1987 | Hackleman et al. | 346/140 R |
| 4,754,141 | 6/1988 | Mindock | 250/343 |
| 4,999,650 | 3/1991 | Braun | 346/140 R |
| 5,081,474 | 1/1992 | Shibata et al. | 346/140 R |
| 5,175,565 | 12/1992 | Ininaga et al. | 346/140 R |

OTHER PUBLICATIONS

*Encyclopedia of Physics,* 2nd ed, Lerner et al. editors, VCH Publisher, Inc, NY. 1991 (No month) excerpts, pp. 281–282, 1119, 1151–1154, 1287–1292 *Modern Dictionary of Electronics,* Rudolf Graf, Howard W. Sanes & Co.. Inc., 1962 (no month) pp. 197–199.

*Primary Examiner*—Marianne Padgett

[57] ABSTRACT

A heater array for an ink jet printhead includes an insulating substrate, which can be a layer of ceramic, flexible plastic, insulated flexible metal, polysilicon, or single crystalline silicon. A first material layer is deposited atop the insulating substrate and patterned in parallel stripes. A first insulating layer is deposited atop the first material layer and patterned with contact windows above the first material layer in corresponding desired heating locations, usually in a symmetrical grid. A second material layer is deposited atop the first insulating layer and pattern in parallel stripes orthogonal to those in the first material layer. The first and second material layers are in physical and electrical contact with each other through the contact windows in the first insulating layer to form a resistive diode junction at each desired heating location. The entire surface of the heating array is covered with a second insulating layer, with contacts provided to the first and second material layers.

10 Claims, 8 Drawing Sheets

-PRIOR ART-

-PRIOR ART-

-PRIOR ART-

METHOD FOR FORMING THERMAL-INK HEATER ARRAY USING RECTIFYING MATERIAL

CROSS REFERENCE TO RELATED APPLICATION(S)

This is a divisional of application Ser. No. 07/925,355 filed on Aug. 3, 1992 now U.S. Pat. No. 5,414,245.

BACKGROUND OF THE INVENTION

This invention relates generally to heater arrays for an ink jet printer head, and more particularly to a heater array having combined resistor and diode heating elements.

A typical ink jet printer head contains an ink reservoir, in which the ink completely surrounds an internal heater array. The heater array typically contains multiple heating elements such as thin or thick film resistors, diodes, and/or transistors. The heating elements are arranged in a regular pattern for heating the ink to the boiling point. Each heating element in the heater array can be individually or multiply selected and energized in conjunction with other heating elements to heat the ink in various desired patterns, such as alpha-numeric characters. The boiled ink above the selected heating elements shoots through corresponding apertures in the ink jet printer head immediately above the heater array. The ink jet droplets are propelled onto printer paper where they are recorded in the desired pattern.

A schematic of a typical resistor type heater array is shown in FIG. 1. It should be noted that other types of heater arrays are used, wherein each resistor is individually addressed and coupled to a common ground node. Heater array 10, however, includes multiple row select lines $A_1$ through $A_M$, wherein select lines $A_1$ through $A_3$ are shown, and multiple column select lines $B_1$ through $B_N$, wherein select lines $B_1$ through $B_3$ are shown. Spanning the row and column select lines are resistor heating elements $R_{11}$ through $R_{MN}$, wherein resistor heating elements $R_{11}$ through $R_{33}$ are shown. A specific resistor is selected and energized by, for example, grounding a column line coupled to one end of the resistor and applying a voltage to the appropriate row line coupled to the opposite end of the resistor.

One problem with heater array 10 involves unwanted power dissipation due to "sneak paths." Such sneak paths energize resistor heating elements other than the one desired, even if non-selected row and column select lines are open-circuited. Sneak paths in heater array 10 are best demonstrated by analyzing the current flow in the array. If resistor $R_{11}$ is selected a current flows between row select line $A_1$ and column select line $B_1$. However, a parallel resistive path exists through non-selected resistors $R_{12}$, $R_{22}$, and $R_{21}$, even if row select line $A_2$ and column select line $B_2$ are both open-circuited. If row select line $A_1$ is more positive than column select line $B_1$, current flows through row select line $A_1$ into resistor $R_{12}$, through column select line $B_2$, through resistor $R_{22}$, through row select line $A_2$, through resistor $R_{21}$, and finally into column select line $B_1$. This is but one example of numerous sneak paths in the heater array 10, involving every resistor in the array. Due to the undesirable sneak paths in heater array 10 and consequent energizing of nonselected heating elements, the power dissipation of the array is unnecessarily and significantly increased.

A schematic of a typical diode type heater array is shown in FIG. 2. Heater array 11 includes the same multiple row and column select lines shown in the resistor heater array 10. Spanning the row and column select lines are diode heating elements $D_{11}$ through $D_{MN}$, wherein diode heating elements $D_{11}$ through $D_{33}$ are shown. A specific diode heating element is selected and energized by, for example, grounding a column line coupled to the cathode of the diode and applying a current to the appropriate row line coupled to the anode of the diode.

The problem of sneak paths is substantially eliminated in heater array 11 due to the unidirectional current flow allowed by the diode heating elements. For example, if diode $D_{11}$ is selected a current flows into row select line $A_1$ through diode $D_{11}$ and out of column select line $B_1$. However, the sneak current flow path that existed in the resistive heater array 10 through non-selected resistors $R_{12}$, $R_{22}$, and $R_{21}$, no longer exists. Current flowing out of the cathode of diode $D_{11}$ cannot flow into the cathode of diode $D_{21}$. Similarly, current flowing into the anode of diode $D_{11}$ cannot flow into the anode of diode $D_{12}$, since the cathode of diode $D_{12}$ is coupled to the cathode of diode $D_{22}$.

Although the problem of sneak paths is substantially solved in heater array 11, another problem exists regarding the physical layout of the diodes on an integrated circuit. Typically, discrete diodes are fabricated on a crystalline silicon substrate to form the array. Since each diode must be made physically large to handle a large current density necessary to boil the ink, and since each diode must be insulated from adjacent diodes, the resulting array occupies a large silicon die area. Consequently, the size and topography of the integrated heater array limits the maximum number of discrete ink jets that can be produced. Another problem with the diode array 11 is that the diodes are not current limited and therefore the power dissipation of the array can be excessive. Still another problem is that the array is fabricated using an expensive integrated circuit process.

A combination transistor/resistor array 12 is shown in FIG. 3. Again, the row and column select lines are identical to those shown in arrays 10 and 11. Spanning the row and column select lines are resistor heating elements $R_{11}$ through $R_{MN}$, wherein resistor heating elements $R_{11}$ through $R_{33}$ are shown, in series with field-effect transistors $M_{11}$ through $M_{MN}$, wherein transistors $M_{11}$ through $M_{33}$ are shown. In contrast to the previous heater arrays, the column select lines are coupled to and selectively energize the gates of the transistors. No heating current actually flows through the column select lines. The row select lines are typically coupled to a power supply voltage or a high impedance. The heating occurs in the resistors similar to array 10, with all the heating current flowing to ground and not from column line to row line.

The configuration of array 12 also solves the problem of sneak paths as well as unlimited power consumption, since the power is limited by the applied voltage at the row select lines and value of the heating resistors. However, as in array 11, the maximum size of the array is limited and the cost of the array is high due to the conventional integrated circuit fabrication techniques that are used. Similar problems exist in an integrated heater array using discrete resistors and diodes.

What is desired is a low cost, low power, and compact fabrication technique for an ink jet heater array.

SUMMARY OF THE INVENTION

It is, therefore, an object of the invention to provide a low cost heater array for an ink jet printer.

Another object of the invention is to provide a highly compact heater array capable of printing a large number of tightly spaced ink dots.

A further object of the invention is to provide a power limit feature for a heater array.

According to the present invention, a heater array for an ink jet printhead includes an insulating substrate, which can be a layer of ceramic, flexible plastic, insulated flexible metal, polysilicon, or single crystalline silicon. A first material layer is deposited atop the insulating substrate and patterned in a first predetermined pattern such as parallel stripes. A first insulating layer is deposited atop the first material layer and patterned with contact windows above the first material layer in corresponding desired heating locations, usually in a symmetrical grid. A second material layer is deposited atop the first insulating layer and patterned in a second predetermined pattern such as parallel stripes orthogonal to those in the first material layer. The first and second material layers are in physical and electrical contact with each other through the contact windows in the first insulating layer to form a resistive diode junction at each desired heating location. The entire surface of the heating array is covered with a second insulating layer, with contacts provided to the first and second material layers. The first and second material layers are chosen to form a resistive diode, which may have a large reverse saturation current. The first and second material layers can be a metal and a semiconductor, or two oppositely doped polysilicon or silicon layers. In addition, the material layers can be configured to form saturated diodes in which the forward current is limited to a predetermined maximum current.

The foregoing and other objects, features and advantages of the invention will become more readily apparent from the following detailed description of a preferred embodiment of the invention which proceeds with reference to the accompanying drawings.

DETAILED DESCRIPTION

Figure 1:
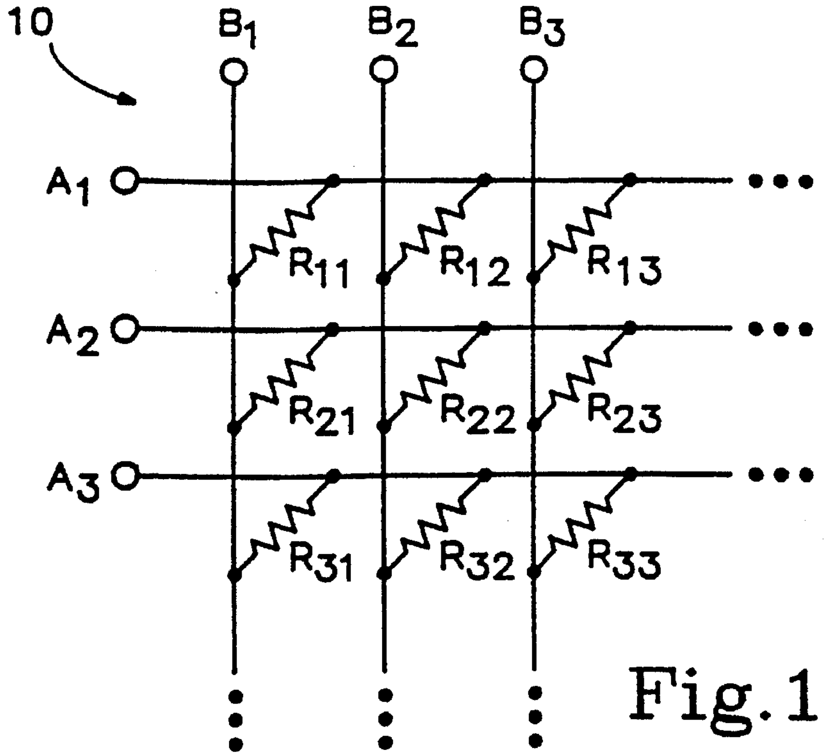
FIGS. 1–3 are schematics of prior art ink jet printer heater arrays.
Figure 2:
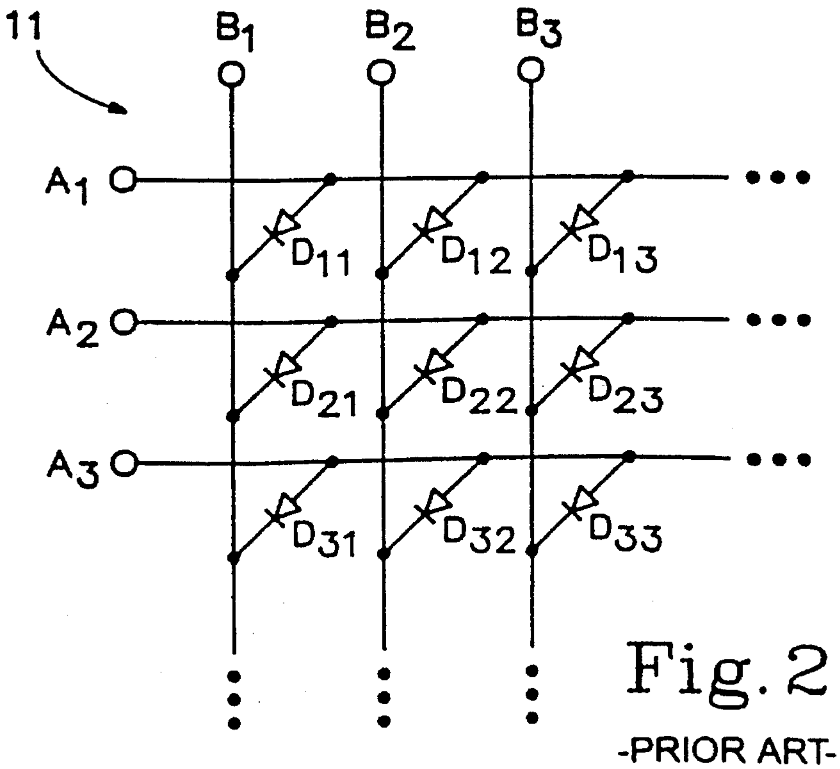
Figure 3:
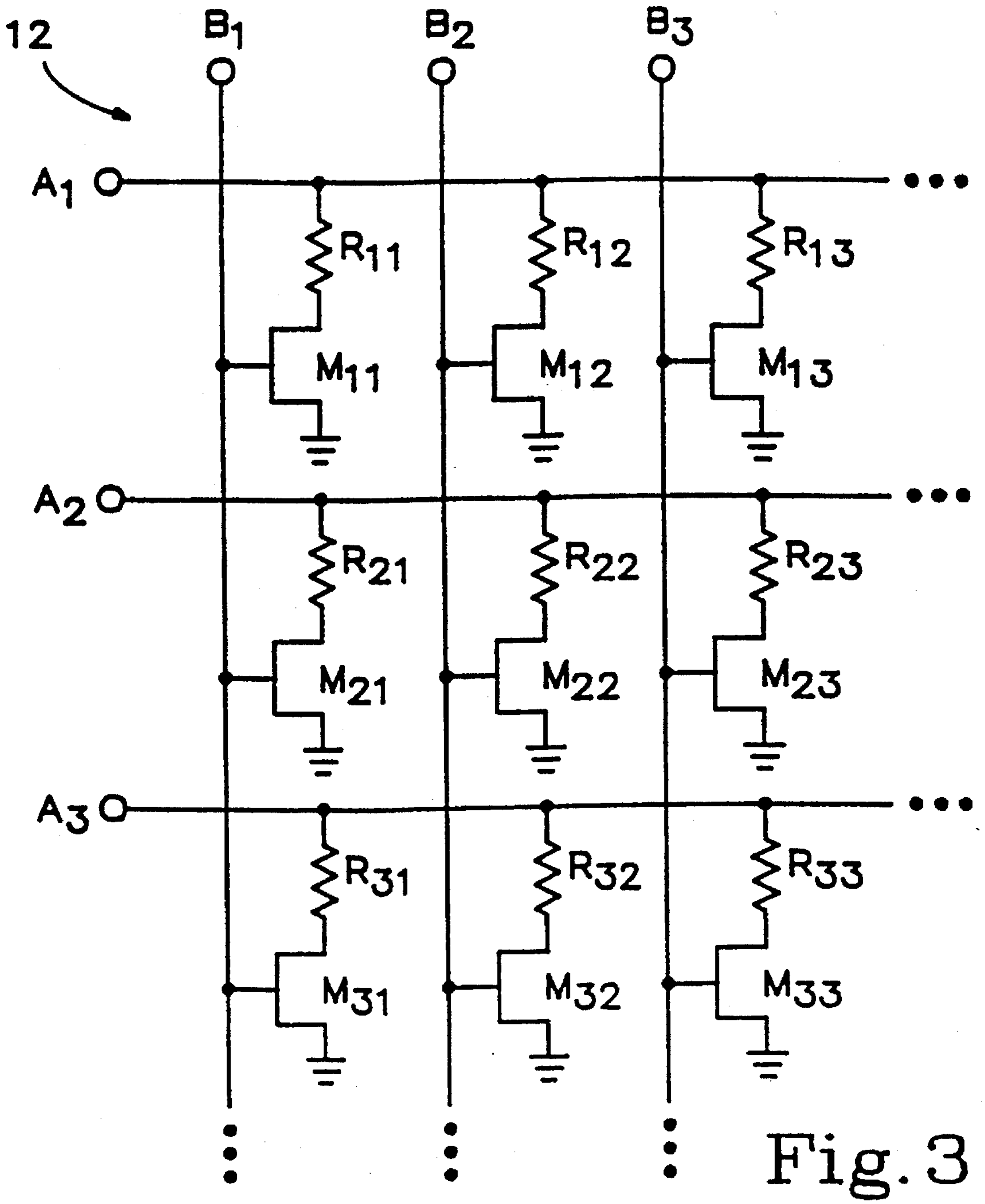
Figure 4:
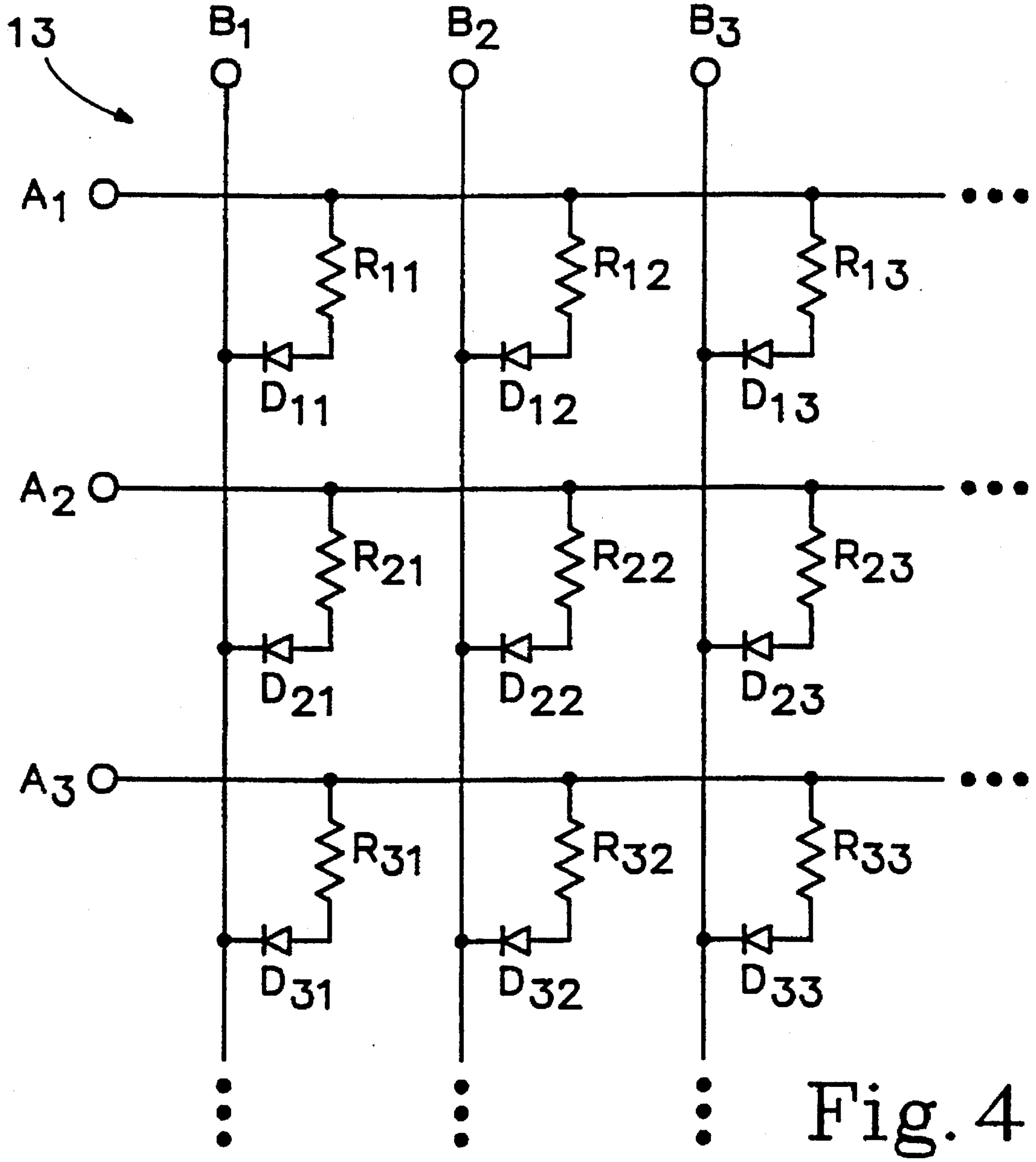
FIG. 4 is a schematic of a combined diode/resistor heater array according to the present invention.

A schematic diagram of the merged diode/resistor heater array 13 for an ink jet printer according to the present invention is shown in FIG. 4. Heater array 13 includes multiple row select lines $A_1$ through $A_M$, wherein select lines $A_1$ through $A_3$ are shown, and multiple column select lines $B_1$ through $B_N$, wherein select lines $B_1$ through $B_3$ are shown as in previous arrays 10–12. Spanning the row and column select lines are merged diode/resistor heating elements $D_{11}$–$R_{11}$ through $D_{MN}$–$R_{MN}$, wherein diode/resistor heating elements $D_{11}$–$R_{11}$ through $D_{11}$–$R_{33}$ are shown. Although the rectifying and resistive portions of the heating elements are shown as discrete diode and resistor symbols, the two portions are in fact merged in a single device according to the process steps described in further detail below. A specific diode/resistor heating element is selected and energized by, for example, grounding a column line coupled to one end of the anode side of the heating element and applying a voltage or current to the appropriate row line coupled to the cathode side of the heating element.

Figure 5:
FIGS. 5–11 are cross-sectional views of the heater array of the present invention at selected steps in the fabrication process.

The process steps for the fabrication method of the heater array are shown in cross sectional views in FIGS. 5–11 and in the plan views of FIGS. 12–15. Referring now to FIG. 5, the heater array 13 for an ink jet printhead includes a substrate 14, which can be a layer of ceramic, flexible plastic, insulated flexible metal such as stainless steel or copper, polysilicon, single crystalline silicon, fiberglass, or an oxide such as glass or sapphire. The choice of material is dependent upon the exact application in which the ink jet printhead is used. In general, the substrate material is selected by considering thermal stability, ease of fabrication, cost, and durability. It should be noted that polymer-based substrates such as plastics or fiberglass are thermally unstable. If a plastic substrate is used, it is therefore desirable that a type of plastic be used that can withstand the temperatures of subsequent processing steps. It should also be noted that silicon or polysilicon based substrates are relatively expensive and brittle, and may not be suitable for all applications. The range of thicknesses for the substrate range from about 0.05 inch down to a minimum practical thickness of about 0.001 inch. Materials such as polymers and metals can be effectively manufactured at a thickness of 0.001 inch. Silicon wafers are generally between 0.01 and 0.025 inch in thickness.

Figure 6:
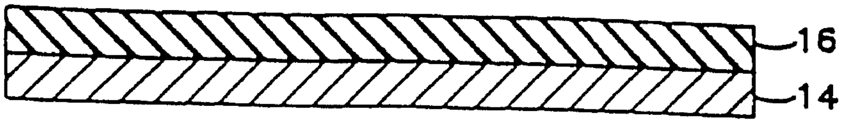

If a conductive or semi-conductive substrate is used, it is desirable that an insulating layer 16 be deposited on top of the substrate 14 to form an insulating substrate, as shown in FIG. 6. A one micron thick insulating layer is generally sufficient, although a typical range is between 0.25 to 2.0 microns. The exact insulating layer thickness is dependent upon the type of material selected, the manufacturing process, and the operational voltages used in the operation of the printhead.

Figure 7:
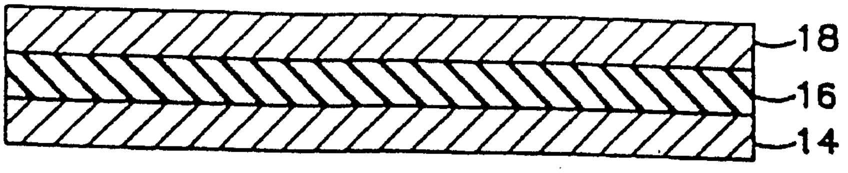
Figure 8:
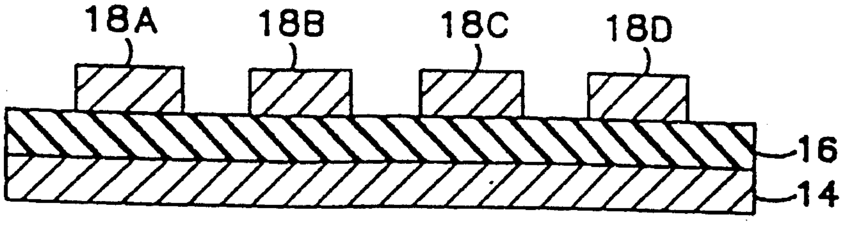

Referring now to FIGS. 7–8, a first material layer 18 is deposited atop the insulating substrate and patterned to form parallel stripes 18A–18D. The first material layer is either a conductor material having a thickness of about 0.01 microns to 1.0 micron, with a nominal of 0.5 microns or a doped semiconductor material having a thickness range from 0.1 to 10 microns, with a nominal thickness of about 2.0 microns. The exact thickness, however, is also dependent upon the type of material selected, the manufacturing process, and the operating voltages used. The parallel stripes 18A–18D are also shown in the plan view of FIG. 12. Although parallel stripes are shown, other types of design patterns can be used as demanded by the printing array firing nozzle positions. The pitch of the parallel stripes 18A–18D can be as close as one micron from center line to center line of the stripe. For standard printing technology applications, i.e. about 1200 ink jet dots per inch, a pitch of about 20.0 to 80.0 microns is typical.

Figure 9:
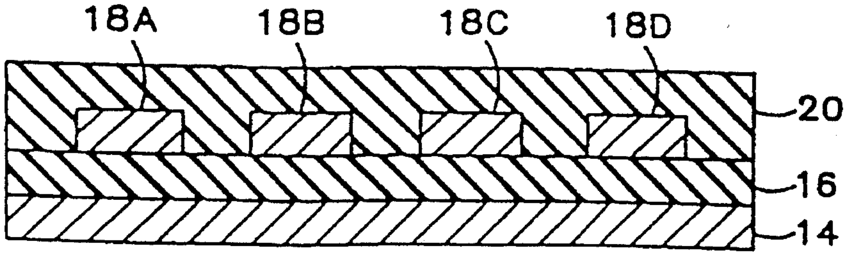

Referring now to FIG. 9, an insulating layer 20 is deposited atop the patterned first material layer 18. In turn the insulating layer 20 is patterned with contact windows 22A–22D above the first material layer 18 in corresponding desired heating locations, usually in a symmetrical grid. The symmetrical grid of heating locations is clearly shown in the plan view of FIG. 13. Contact window size is determined by the amount of current passing though the resistive diode heating element and by the specific resistivity of the materials in the heating element. Thus, the size of the contact window can vary widely, with a minimum size being 0.25 microns on a side, a maximum size being 100 microns on a side, and a typical size being about 2.0 microns on a side.

Figure 10:
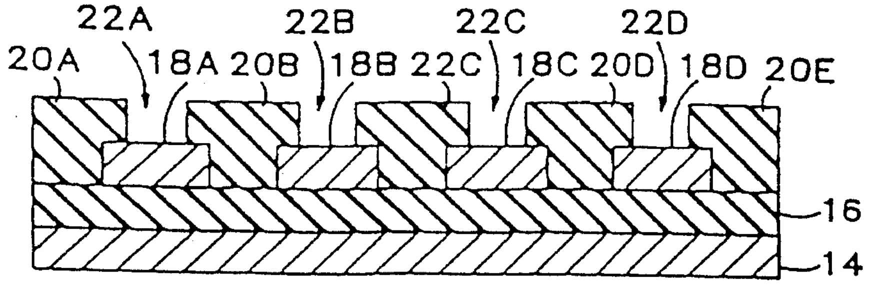

Referring now to FIG. 10, a second material layer 24 is deposited atop insulating layer 20 and patterned in parallel stripes orthogonal to those in the first material layer 18. Other design patterns can be used in conjunction with the pattern used for the first material layer 18. The orthogonal stripes 18A–18D and 24A–24D are shown in the plan view of FIG. 14, with the insulating layer 16 removed. The entire surface of the heating array 13 is covered with a second insulating layer (not shown), with contacts provided to the stripes of the first and second material layers. Contacts 26A–26D to the first material layer 18, and contacts 28A–28D to the second material layer 24 are shown in the plan view of FIG. 15. Again, insulating layer 16 has been removed from the plan view of FIG. 15 for clarity. The thicknesses of the second material layer 24 is selected according to the guidelines provided for the first material layer 18. The thickness of the top insulating layer and the dimensions of the contacts 26A–26D and 28A–28D are not critical, but care should be used to not unnecessarily increase parasitic resistance or otherwise adversely impact array performance.

Figure 11:
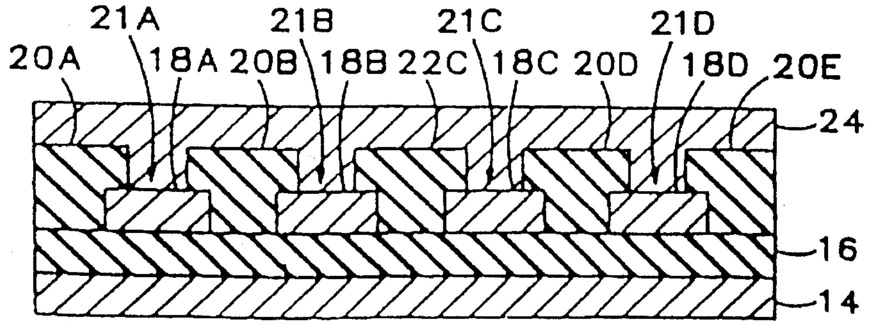
Figure 12:
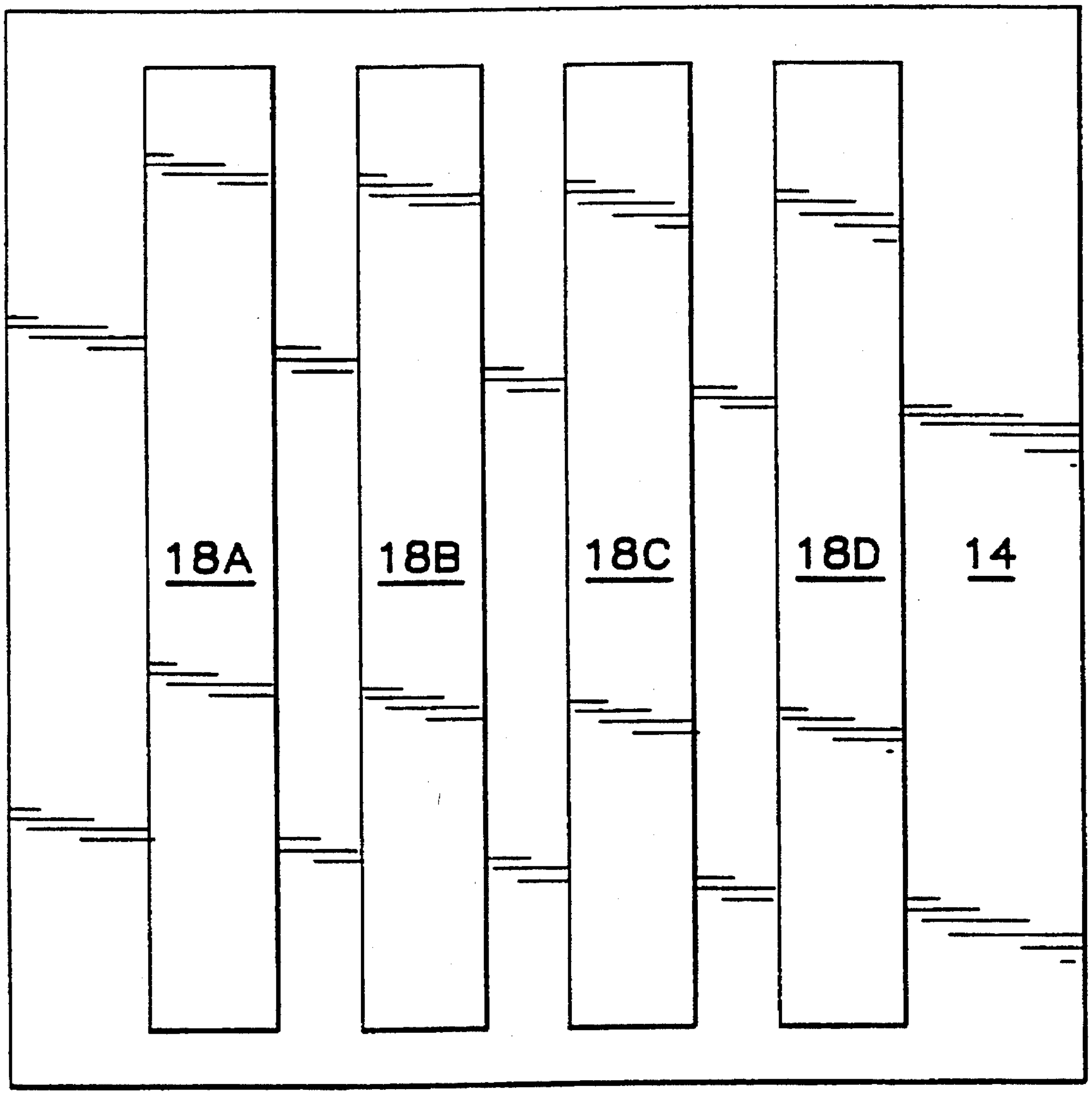
FIG. 12 is a plan view corresponding generally to FIG. 8.
Figure 13:
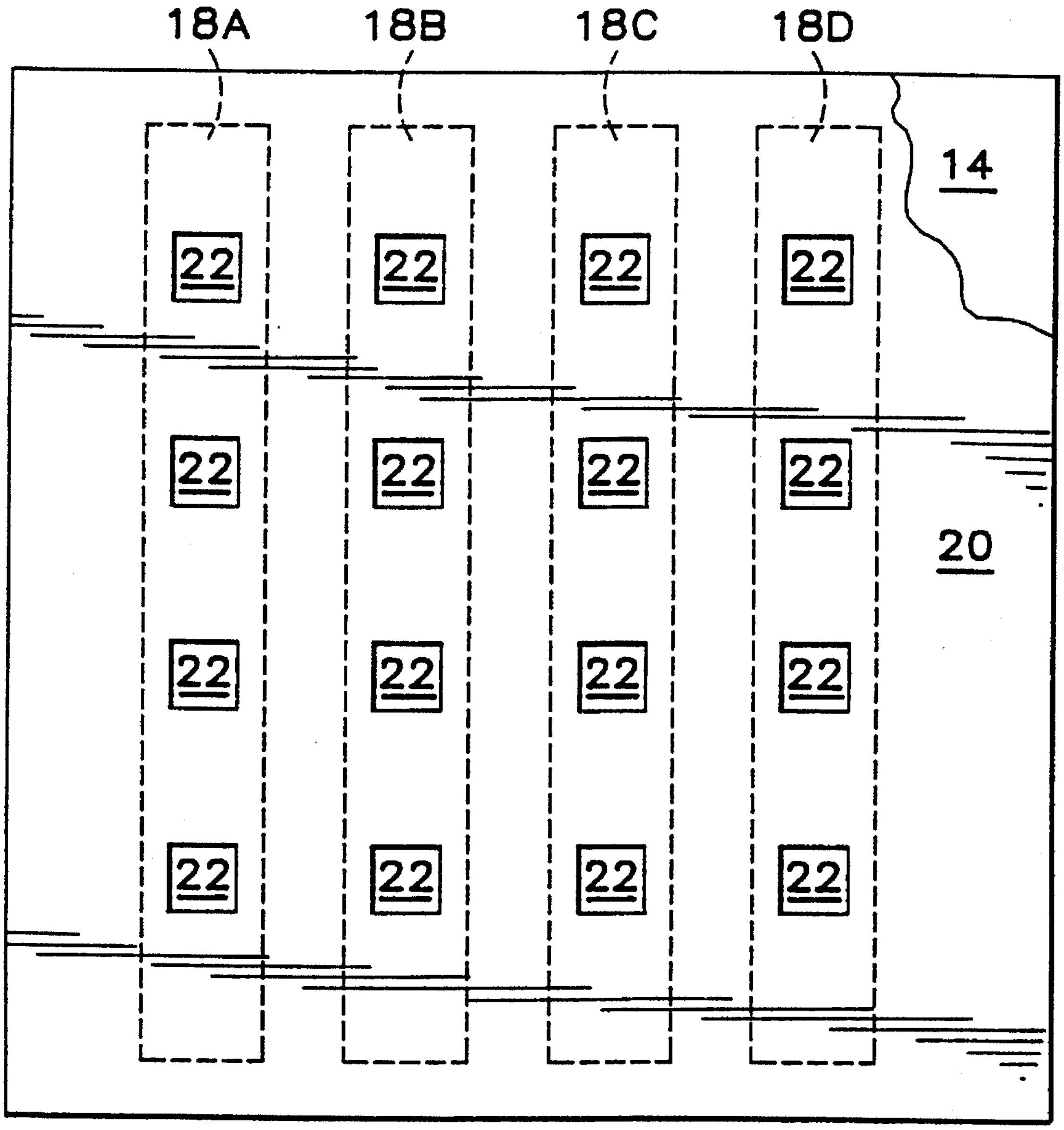
FIG. 13 is a plan view corresponding generally to FIG. 10.
Figure 14:
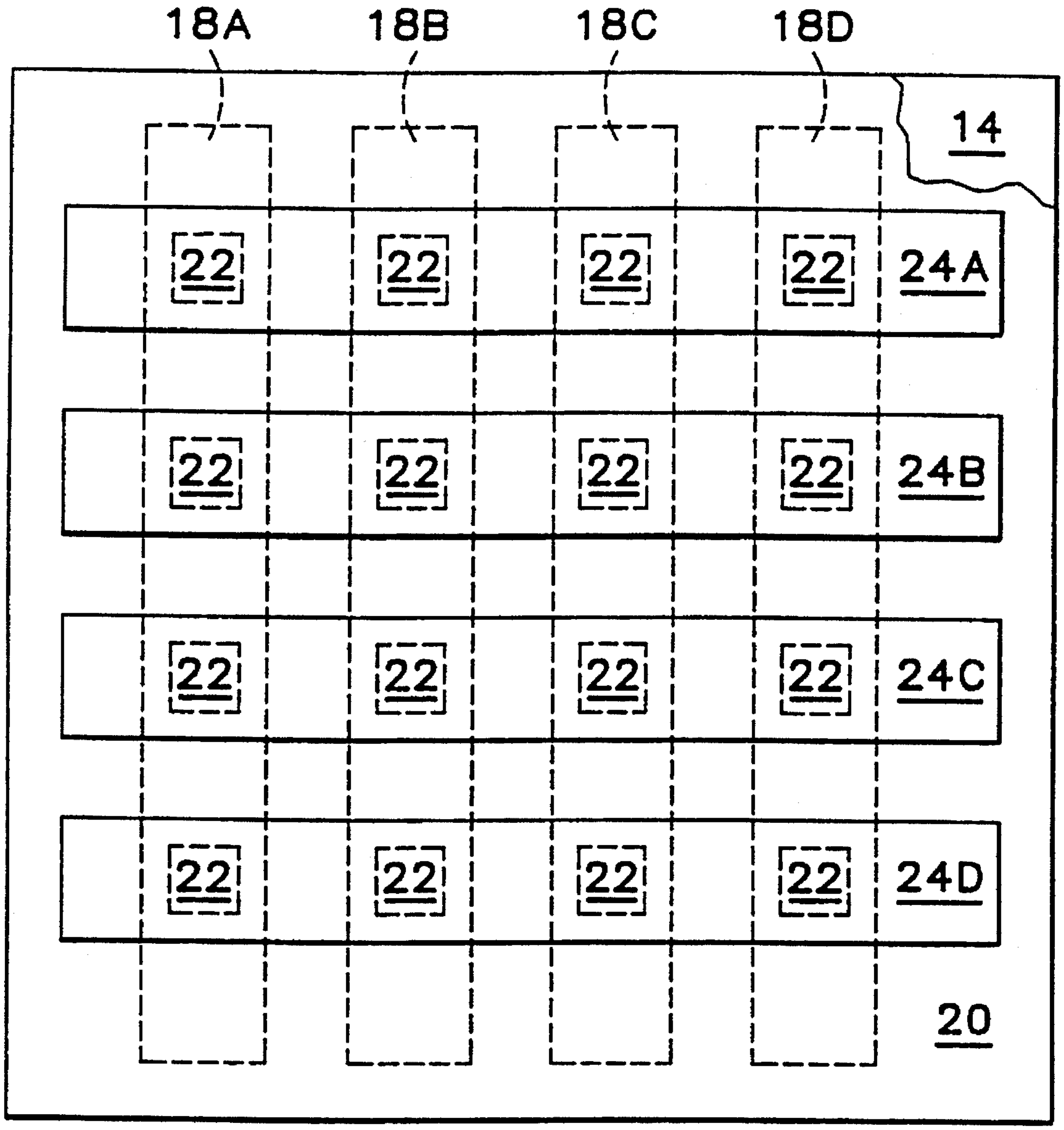
FIGS. 14–15 are plan views of the heater of the present invention at two final fabrication process steps.
Figure 15:
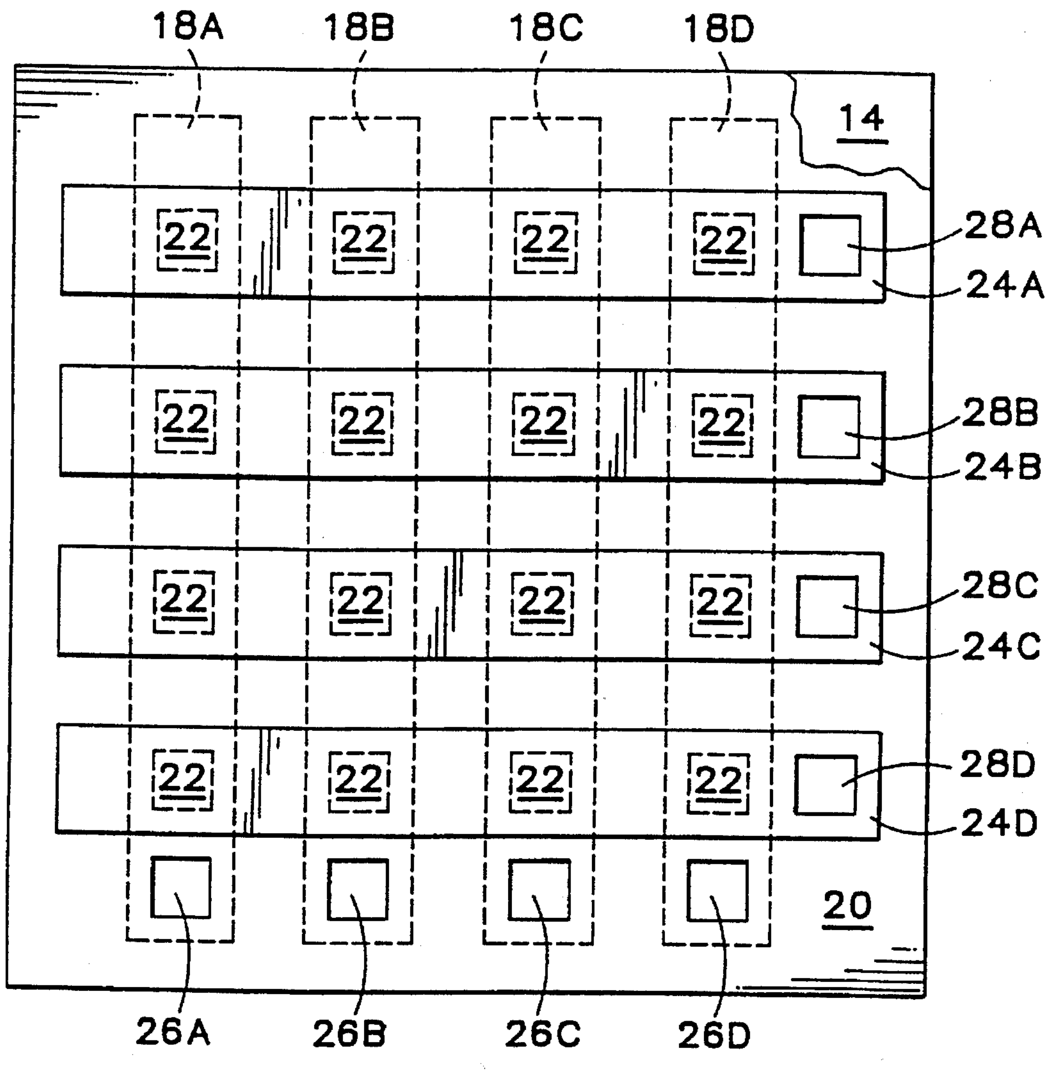

Referring back to the cross sectional view of FIG. 11, the first and second material layers 18 and 24 are in physical and electrical contact with each other through the contact windows 22A–22D to form vertical, resistive diode junctions 21A–21D at desired heating locations. The diode junctions 21A–21D are at the interface between the first and second material layers, while the resistive portion is formed vertically by the space charge region extending vertically into each material layer. The first and second material layers 18 and 24 are therefore specifically chosen as a pair to form a resistive rectifying junction. The lumped model is shown in FIG. 4 as the series combination of a resistor and a diode. The resultant diode may have a relatively large reverse saturation current, as long as the current through the non-selected heating elements (the reverse saturation current) is much less than the active forward heating current. The first and second material layers 18 and 24 can be a metal and a semiconductor, or two oppositely doped polysilicon or silicon layers, or other oppositely doped semiconductor layers. There are numerous candidates for the first and second material layers 18 and 24 that would form a resistive diode junction. They include, but are not limited to: doped polysilicon, silicon, germanium, GaAs, galena (PbS), and other doped semiconductor materials; and iron/iron oxide, copper/copper oxide, and other metal/semiconductor junctions wherein the metal is comprised of platinum, gold, silver, or aluminum.

Figure 16:
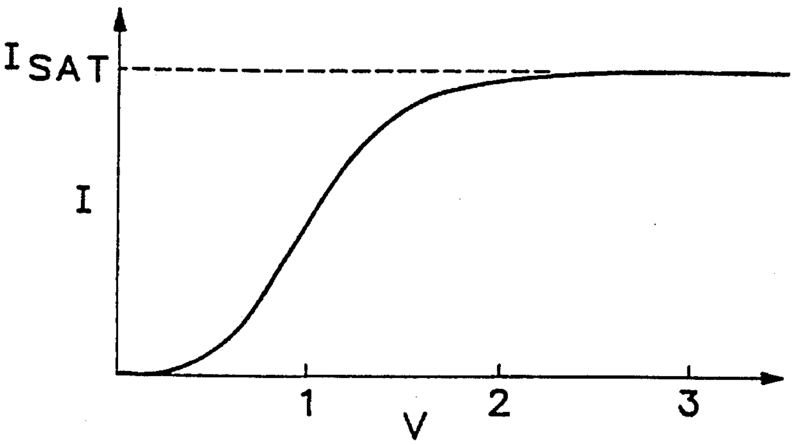
FIG. 16 is a plot of a diode current curve showing a limited forward current.

In addition, the semiconductor material layers can be doped and configured to form saturated diodes in which the forward current is limited to a predetermined maximum current. Several such devices are described in the literature and can be fabricated in a great number of different ways by those skilled in the art. A detailed discussion of current limiting diodes appears in "Physics of Semiconductor Devices" by S. M. Sze, published by John Wiley and Sons in 1969, at pp. 357–361, which is hereby incorporated by reference. The resulting forward current limiting characteristic of a saturated diode is shown in the graph of FIG. 16. Even if a saturated diode is not used, the junction resistance itself provides an upper current limit if power is provided to the printhead array with a constant voltage supply.

Having described and illustrated the principles of the invention in a preferred embodiment thereof, it is apparent to those skilled in the art that the invention can be modified in arrangement and detail without departing from such principles. For example, the exact pattern of the first and second material layers 18 and 24 can be altered in many different ways to form the grid of resistive junctions in corresponding heating locations. Any number of heating locations can be used. Additional metal layers can be added after depositing and patterning the first and second material layers to cut down on the horizontal resistance of the material layers not immediately associated with the resistive junction. The exact method of contacting the first and second material layers can also be changed. Current-limited structures can be used to limit the maximum power consumed by the heating array, if desired. I therefore intend the invention to cover all modifications and variation coming within the spirit and scope of the following claims.

I claim:

1. A fabrication method for a heater array in an ink jet printer, the method comprising the steps of:

forming an insulating substrate;

depositing a first material layer atop the insulating substrate;

patterning the first material layer;

depositing a first insulating layer atop the patterned first material layer;

patterning a plurality of contact windows in the first insulating layer at desired heating locations;

depositing a second material layer atop the patterned first insulating layer such that the first and second material layers are in physical contact with each other through the contact windows in the first insulating layer;

forming contacts on the first material layer; and forming contacts on the second material layer, wherein each physical contact region between the first and second material layers forms a vertically extending resistive diode junction within the contact window at the desired heating locations, the resistive diode junction in a forward biased condition transferring conductive heat directly to ink in the ink jet print head while simultaneously limiting forward current in said resistive diode junction.

2. The method of claim 1 in which the step of patterning the first material layer comprises the step of patterning the first material layer into a plurality of stripes.

3. The method of claim 2 in which the step of patterning the second material layer comprises the step of patterning the second material layer into a plurality of stripes orthogonal to the stripes of the first material layer.

4. The method of claim 1 further comprising the step of doping at least one of the first and second material layers.

5. The method of claim 1 wherein the steps of forming contacts on the first material layer and forming contacts on the second material layer comprises forming individual contacts each associated with a selected resistive diode junction, the individual contacts on the first material layer formed in electrical isolation from each other and individual contacts on the second material layer formed in electrical isolation from each other providing selectable energization of each one of the contacts.

6. The method of claim 1 further comprising the step of depositing a second insulating layer atop the patterned second material layer.

7. A method according to claim 5 wherein the resistive diode junction is formed in the physical contact region to generate heat when the associated individual contacts are energized.

8. A method for fabricating a heater array in an ink jet printhead, comprising:

forming an insulating substrate;

depositing a first material layer atop the insulating substrate;

patterning the first material layer;

depositing a first insulating layer atop the patterned first material layer;

patterning a plurality of contact windows in the first insulating layer at desired heating locations; and depositing a second material layer atop the patterned first insulating layer such that the first and second material layers form an interface in physical contact within a region in the contact windows;

wherein each said physical contact region interface between the first and second material layers forms a vertically extending resistive diode junction having a resistive portion formed vertically by a space charge region extending into each of the first and second material layers at the desired heating locations, the physical contact region of the resistive diode junction transferring conductive heat directly to ink in the ink jet printhead while simultaneously limiting forward current in said diode junction.

9. A method according to claim 8 including the step of forming multiple apertures immediately above each resistive diode junction, the apertures directing dispersion of the ink onto a print medium after being heated by the corresponding resistive diode junction.

10. A method according to claim 8 wherein the step of forming the physical contact region includes selecting material for the first and second material layers that form a resistive diode junction for heating the ink when said diode junction is in a forward biased condition.

* * * * *